United States Patent [19]

Chen et al.

[11] Patent Number: 5,045,747
[45] Date of Patent: Sep. 3, 1991

[54] APPARATUS FOR POLING A PIEZOELECTRIC CERAMIC

[75] Inventors: Yun-Tien Chen, Hsinchu; Syh-Yuh Cheng, Taichung; Shu-Fen Liao, Yun Lin, all of Taiwan

[73] Assignee: Industrial Technology Research Institute, Chutung, Taiwan

[21] Appl. No.: 486,139

[22] Filed: Feb. 28, 1990

[51] Int. Cl.$^5$ .............................................. H01L 41/08
[52] U.S. Cl. ..................................... 310/357; 29/25.35
[58] Field of Search ................ 310/357, 358; 361/233; 250/374; 29/25.35

[56] References Cited

U.S. PATENT DOCUMENTS

| | | | |
|---|---|---|---|
| 2,777,188 | 1/1957 | Remeika | 29/25.35 |
| 3,213,027 | 3/1962 | Fatuzzo | 310/357 |
| 3,924,324 | 12/1975 | Kodera | 361/233 |
| 4,079,437 | 3/1978 | Sheffield | 361/233 |
| 4,088,917 | 5/1978 | Martin et al. | 361/233 |
| 4,340,786 | 7/1982 | Tester | 310/324 |
| 4,345,359 | 8/1982 | Micheron | 310/357 |
| 4,377,839 | 3/1983 | Blomgren et al. | 361/233 |
| 4,426,580 | 1/1984 | Smith | 250/374 |
| 4,527,218 | 7/1985 | von Seggern | 361/233 |

FOREIGN PATENT DOCUMENTS 0060788 4/1985 Japan .................................. 310/358

Primary Examiner—Mark O. Budd
Assistant Examiner—Thomas M. Dougherty
Attorney, Agent, or Firm—Ladas & Parry

[57] ABSTRACT

An apparatus for poling a piezoelectric ceramic includes a first and a second electrode which are connected to a DC power supply and spaced away from one another at a certain distance, and an insulated medium provided between the first and second electrodes. The second electrode is adapted to carry the piezoelectric ceramic which is spaced away from the first electrode. In this way, a piezoelectric ceramic can be poled by a poling field created between the first and second electrodes and prevented from being scraped by the first electrode or damaged by the ripples caused by an unstable voltage because of the separation of the piezoelectric ceramic to be poled from the first electrode and the buffering effect caused by the insulated medium between the first and second electrodes. In addition, the second electrode may be specifically in the form of a power-driven metal conveyor so that the piezoelectric ceramic to be poled can continuously pass through and be poled by the poling field.

3 Claims, 3 Drawing Sheets

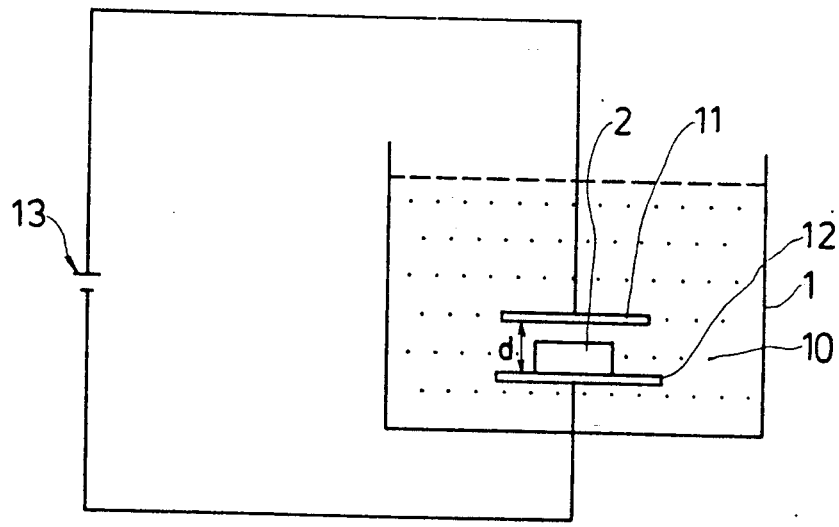
F I G. 2

APPARATUS FOR POLING A PIEZOELECTRIC CERAMIC

BACKGROUND OF THE INVENTION

This invention relates to an apparatus for poling a piezoelectric ceramic, more particularly to an apparatus for poling a piezoelectric ceramic which has two spaced electrodes, wherein the piezoelectric ceramic to be poled is placed on one of said two electrodes and spaced away from the other one of said two electrodes.

It is known that the piezoelectric electric effect of a ceramic material may be provided by poling said ceramic material. Referring to FIG. 1, a conventional apparatus for poling a piezoelectric ceramic includes a poling tank 90 in which the silicon oil 91 is contained. A piezoelectric ceramic disc 92 is dipped in said silicon oil 91. Two sides of said piezoelectric ceramic disc 92 are electroplated by a layer of silver 93, and the disc 92 is placed on a metal plate 94. The upper layer of silver 93 and the metal plate 94 are respectively connected to the positive and negative electrodes of a DC power supply 95 so as to apply a given voltage to the piezoelectric ceramic disc 92. In this way, the piezoelectric ceramic disc can be poled in a poling field resulting from said given voltage and a suitable temperature of the silicon oil 91 in the poling tank 90. However, since the upper layer of silver 93 is connected to the positive electrode of the DC power supply 95 via the contact of a probe 96, said upper layer 93 silver is liable to be scraped off from said piezoelectric ceramic disc 92 by said probe 96. In addition, when the voltage applied to the piezoelectric ceramic disc 92 is high and unstable, said piezoelectric ceramic disc 92 will be damaged or broken due to the ripple caused by said high voltage from said DC power supply 95. This will lower the production yield of the poled piezoelectric ceramic disc. Moreover, by using said conventional apparatus for poling a piezoelectric ceramic disc, it is necessary to pay attention to the poling time of the piezoelectric ceramic disc during the poling process and replace the piezoelectric ceramic disc which has been poled with a disc which has not been poled at the end of the poling process. These procedures are messy and involve high labor-costs. Moreover, the piezoelectric ceramic disc is liable to be damaged during said replacement process. Therefore, such a conventional poling apparatus is not suited for use in a fully automated industry which requires mass production of piezoelectric ceramics.

SUMMARY OF THE INVENTION

It is therefore an object of this invention to provide an apparatus for poling a piezoelectric ceramic which has two spaced electrodes one of which is not in contact with the piezoelectric ceramic to be poled, so that said piezoelectric ceramic will neither be damaged by ripple which is caused by the unstable voltage nor scraped by said one of the electrodes.

It is another object of this invention to provide an apparatus for poling a piezoelectric ceramic which can be used in automatic mass production.

Accordingly, an apparatus for poling a piezoelectric ceramic of this invention includes a first and a second electrode which are connected to a DC power supply and spaced away from one another at a distance so as to create a poling field therebetween, and an insulated medium provided between said first and second electrodes. The second electrode is adapted to carry the piezoelectric ceramic which is spaced away from said first electrode. Therefore, a piezoelectric ceramic can be poled without being scraped by the first electrode and without being damaged by the ripple caused by an unstable voltage from said DC power supply because of the separation of the piezoelectric ceramic to be poled from said first electrode and the buffering effect caused by the insulated medium between the electrodes. In addition, the second electrode may be specifically in the form of a power-driven metal conveyor so that the piezoelectric ceramic to be poled can continuously pass through said poling field and be poled thereby. In this way, the piezoelectric ceramic can be used in automatic mass production.

BRIEF DESCRIPTION OF THE DRAWINGS

Other features and advantages of this invention will become apparent in the following detailed description of the preferred embodiments of this invention with reference to the accompanying drawings, in which:

FIG. 2 is a schematic view showing a first preferred embodiment of an apparatus for poling a piezoelectric ceramic of this invention in an operative position;

DETAILED DESCRIPTION OF THE PREFERRED EMBODIMENTS

Figure 1:
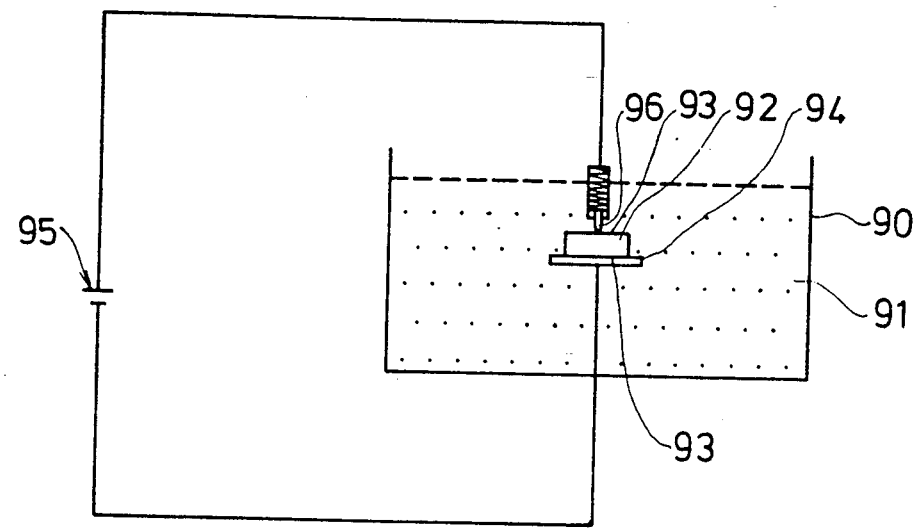
FIG. 1 is a schematic view showing a conventional apparatus for poling a piezoelectric ceramic in an operative position.

Referring to FIG. 2, an apparatus for poling a piezoelectric ceramic of this invention includes a poling tank 1 in which an insulated medium 10, such as silicon oil, is contained. The insulated medium 10, if desired, may be replaced by air. However, the use of silicon oil is preferable. A first and a second electrode 11, 12 are respectively connected to the positive and the negative electrodes of a DC power supply 13 and dipped in the insulated medium 10. The first electrode 11 is located right above the second electrode 12 and spaced away from the second electrode 12 at a certain distance. The first electrode 11 is preferably a copper plate and the second electrode 12 is a metal plate. In this way, a piezoelectric ceramic disc 2 can be poled in a poling field created between said electrodes 11, 12 when said piezoelectric ceramic disc 2 is placed on the second electrode 12. The upper surface of the disc 2 is spaced from the first electrode 11 by a distance (d).

Figure 3:
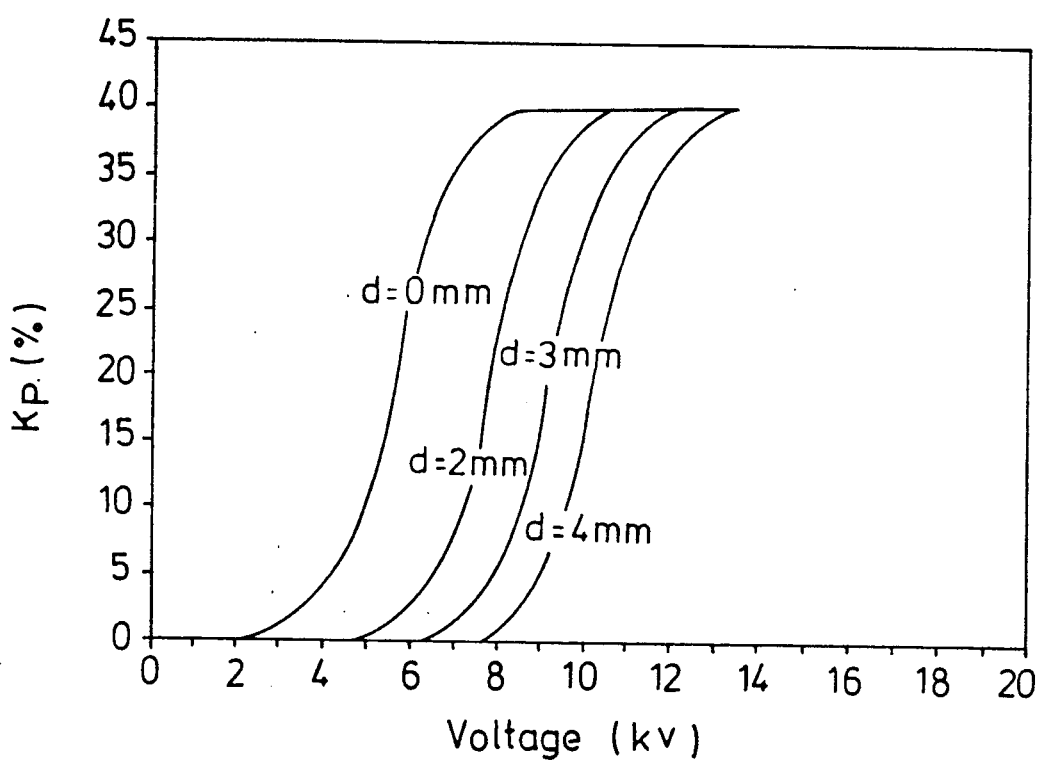
FIG. 3 is a diagram showing the relationship between the electrical-mechanical coupling factor (Kp) and the voltage applied to the apparatus for poling a piezoelectric ceramic of this invention.

Referring to FIG. 3, a diagram shows the relationship between the electrical-mechanical coupling factor (Kp), i.e. the ratio of the output mechanical energy and the input electrical energy, which is obtained at the different distances (d) between the first electrode 11 and the piezoelectric ceramic disc 2, and the voltage (KV) applied to the piezoelectric ceramic disc 2 in accordance with the present invention. In FIG. 3, the curve (d=0 mm) illustrates the relationship between the electrical-mechanical coupling factor (Kp), and the voltage applied to the piezoelectric ceramic disc 92 of the conventional poling apparatus of the abovementioned type at the precessing temperature of 130° C. It can been seen that when the Kp value of the piezoelectric ceramic is kept constant, the greater the distance (d) between the first electrode 11 and the piezoelectric ceramic disc 2, the greater the voltage which needs to be applied to the piezoelectric ceramic disc 2. Hence, it is easily understood that by using the poling apparatus of this invention, the Kp value of the abovementioned conventional poling apparatus can be obtained by increasing the voltage applied to the piezoelectric ceramic disc 2. That is to say, the poling apparatus of the present invention can achieve the same effect as a conventional poling apparatus. Moreover, in accordance with the present invention, there is a gap formed between the piezoelectric ceramic disc 2 and the first electrode 11 and an insulated medium 10 provided between the same, preventing said piezoelectric ceramic disc 2 from being damaged or broken by high voltage ripples and scraped during the poling process.

Figure 4:
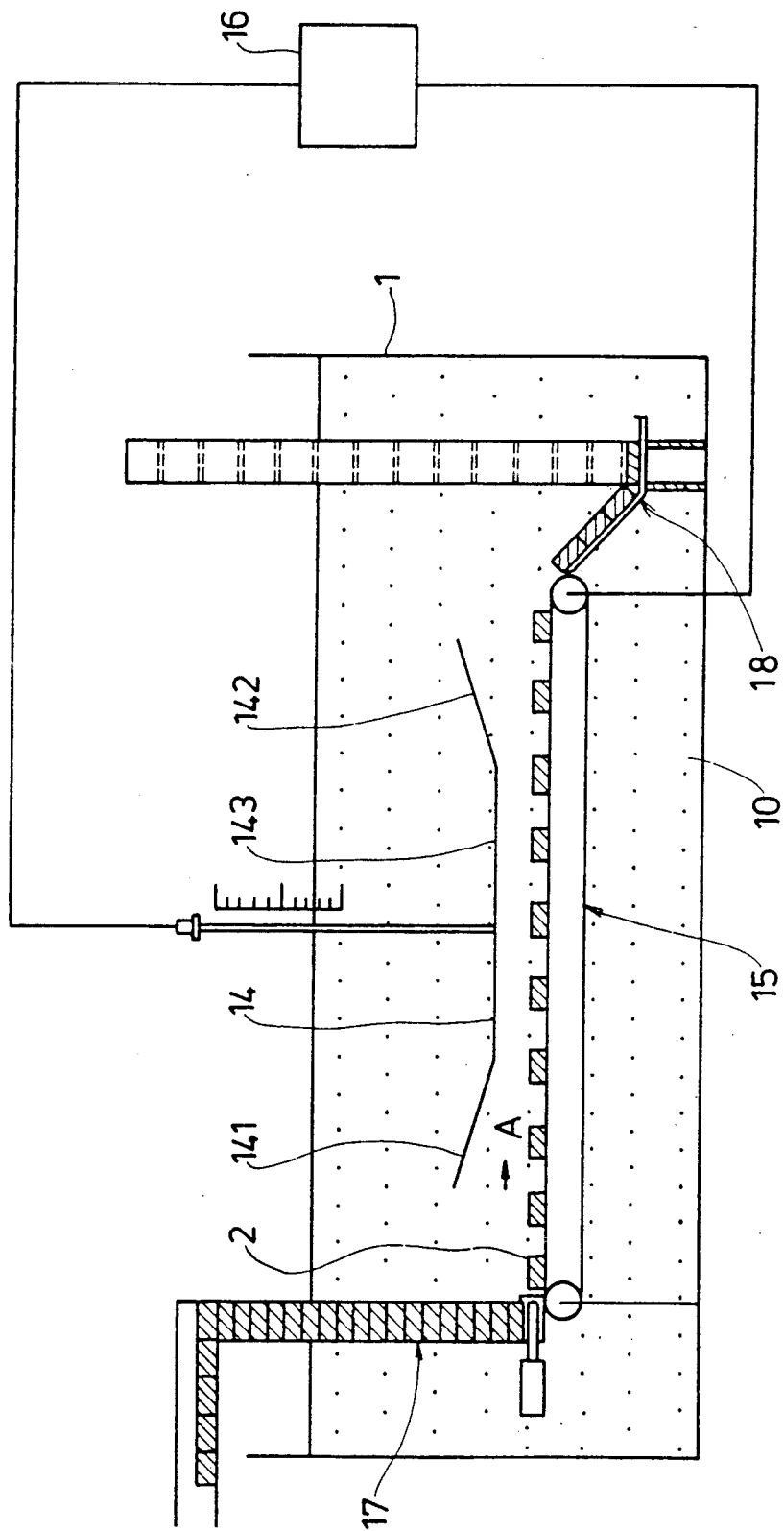
FIG. 4 is a schematic view showing a second preferred embodiment of an apparatus for poling a piezoelectric ceramic of this invention in an operative position.

Referring to FIG. 4, a second preferred embodiment of an apparatus for poling a piezoelectric ceramic disc 2 of this invention includes a poling tank 1 in which a insulated medium 10, such as silicon oil, is contained. A first electrode 14 and a second electrode 15 which is located right below the first electrode 14, are dipped in the insulated medium 10. The first electrode 14 is a copper plate having a flat portion 143, a first and a second upwardly inclined portion 141, 142 extending from two opposite sides of said flat portion 143 and the second electrode 15 is a metal power-driven conveyor. A controlling system 16 is connected to the first and second electrodes 14, 15 so as to preset the required conditions for the poling process, such as the voltage applied to the piezoelectric ceramic disc 2 to be poled, the distance between said two electrodes 14, 15, the temperature within the poling tank 1, and the conveying speed of the power-driven conveyor 1.

In operation, a piezoelectric ceramic disc 2 is passed through a feeding means 17, (for example, a feeding tube), which is provided at one end of the power-driven conveyor 15, and transferred onto the power-driven conveyor 15. The piezoelectric ceramic disc 2 is then moved by the power-driven conveyor 15, in a direction indicated by the arrow (A) as shown in FIG. 4, and passed through a poling field created between said two electrodes 14, 15 so that said piezoelectric ceramic disc 2 can be poled thereby. The piezoelectric ceramic disc 2 to be poled is first exposed to a gradually increasing electric field while passing under the first upwardly inclined portion 141 of the first electrodes 14. The piezoelectric ceramic disc 2 is then exposed to a constant electric field created between the flat portion 143 of the first electrode 14. Thereafter, the piezoelectric ceramic disc 2 is exposed to a gradually decreasing electric field while passing under the second upwardly inclined portion 142 of the first electrode 14. In this respect, the piezoelectric ceramic disc 2 is prevented from a direct application of a high electric field, and thus preventing an occurrence of a voltage surge breaking said piezoelectric ceramic disc 2. It is noted that the poling time, that is, the time which the piezoelectric ceramic disc 2 is exposed to said poling field, can be controlled by presetting the conveying speed of the power-driven conveyor 15. When the piezoelectric ceramic disc 2 has been poled, it is transferred to a collecting means 18, (for example, a collecting box), thus completing the poling process. A plurality of piezoelectric ceramic discs 2 can be continuously poled for mass production by repeating the abovementioned poling process.

It has been found that, by the use of the poling apparatus of this invention, the piezoelectric ceramic to be poled can not only avoid being scraped by an electrode, but also can be prevented from being damaged or broken by the ripples caused by unstable voltage. Moreover, the poling apparatus of the present invention can be used for continuously poling a plurality of piezoelectric ceramics, which is suitable for automated mass production.

With this invention thus explained, it is apparent that numerous modifications and variations can be made without departing from the scope and spirit of this invention. It is therefore intended that this invention be limited only as indicated in the appended claims.

I claim:

1. An apparatus for poling a piezoelectric ceramic comprising:

first and second electrodes which are connected to a DC power supply, said first electrode including a first portion spaced apart from said second electrode at a certain distance so as to create a uniform poling field between said first and second electrodes, said electrode being adapted to convey said ceramic past said first electrode in a direction from a front end of said first portion to a rear end thereof, each of said front and rear ends of said first portion being joined to one of two second portions of said first electrode, each of said second portions comprising an inclined electrode portion which extends away from its corresponding end in a direction overlying said second electrode and at an increasing distance therefrom in a direction away from said first portion, whereby said ceramic is exposed to a gradually increasing poling field as it is conveyed by said second electrode towards said first portion and to a gradually decreasing poling field as it is conveyed away from said first portion, and an insulating medium provided between said first and second electrodes.

2. An apparatus according to claim 1, wherein said second electrode is a power-driven metal conveyor, and including means for feeding said ceramic onto said conveyor at a loading position thereof and for collecting said ceramic from said conveyor at an unloading position thereof.

3. An apparatus for poling a piezoelectric ceramic as claimed in claim 1 further comprising means for adjusting said distance between said first and second electrodes so as to adjust said uniform poling field applied to said piezoelectric ceramic.

* * * * *